(12) United States Patent
Cook et al.

(10) Patent No.: US 6,342,766 B1
(45) Date of Patent: Jan. 29, 2002

(54) POWER MODULE FOR HIGH INTENSITY DISCHARGE LAMP

(75) Inventors: John F. Cook; Barton Kirk Ideker, both of Hendersonville, NC (US); Michael Fenger, Cleveland Heights, OH (US); Byron R. Collins, Tuxedo, NC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/661,257

(22) Filed: Sep. 13, 2000

(51) Int. Cl.[7] ................................................ H01J 13/46
(52) U.S. Cl. ............................ 315/32; 315/56; 315/58; 439/947; 361/640
(58) Field of Search ............................. 315/56, 32, 58, 315/63, 273, 290; 439/40, 43, 56, 68, 947, 950, 956; 361/600, 627, 640; 174/210, DIG. 2

(56) References Cited

U.S. PATENT DOCUMENTS

| | | | | |
|---|---|---|---|---|
| 4,472,015 A | * | 9/1984 | Nicholson et al. ...... 339/156 R |
| 4,488,201 A | * | 12/1984 | Webb et al. ................. 361/334 |
| 4,902,943 A | * | 2/1990 | Nicholson et al. .......... 315/289 |
| 5,148,086 A | * | 9/1992 | Costa .......................... 315/276 |
| 5,448,108 A | * | 9/1995 | Quon et al. ................. 257/714 |
| 5,811,937 A | * | 9/1998 | Jiang ........................... 315/56 |
| 5,811,941 A | * | 9/1998 | Barton ........................ 315/307 |
| 5,946,192 A | * | 8/1999 | Ishigami et al. ............ 361/704 |

* cited by examiner

Primary Examiner—Haissa Philogene
(74) Attorney, Agent, or Firm—Fay, Sharpe, Fagan, Minnich & McKee, LLP

(57) ABSTRACT

A configurable power (10) module for a lamp accepts a wide variety of components and component combinations. The power module can accept a ballast (412), a capacitor (420), an ignitor (416), a voltage selector (44), a wattage selector (460), a switched quartz line lamp relay (440), and a bi-level relay (not shown). Various types and sizes of ballasts, capacitors and ignitors are accommodated. A socket (26) for the ignitor can be a GE ignitor socket. The power socket can aid field diagnostics. Mounting means (84) provided on the power module make it compatible with a wide variety of lighting fixtures.

20 Claims, 8 Drawing Sheets

VIEW A-A

POWER MODULE FOR HIGH INTENSITY DISCHARGE LAMP

BACKGROUND OF THE INVENTION

1. Field of the Invention

This invention relates to a configurable power module for lamps. It finds particular application in providing power for high intensity discharge lamps (HID Lamps). Since the power module is configurable, it can be used to provide power to a wide variety of lamp types, including metal halide, ceramic metal halide, high-pressure sodium, and pulsed metal halide lamps.

2. Discussion of the Art

Traditionally, new lamp and/or light fixture designs have required new ballast and/or power module designs. New power modules have been required because the lamps have different starting techniques, driving voltages, power levels and possibly new backup light sources. At a minimum, most new lamps have new combinations of requirements. Where a particular combination of requirements is not being met by an existing power module, a new power module had to be designed. Furthermore, even where an existing power module meets all the requirements of a lamp, the existing power modules often do not fit in newly designed fixtures. Where existing power modules physically fit in a newly designed fixture, it is likely that the new fixture does not accommodate some other requirement, for example, the heat venting needs of the power module.

This lamp and fixture driven power module design approach has led to a confusing array of over 700 ballasts/power modules and model numbers for one manufacturer alone. Manufacturing and inventory of the multitude of power module products has become problematic for manufacturers, distributors, and retailers.

Power modules have also been traditionally built as assemblies of components. The components are wired together by hand, using a point-to-point wiring technique. This is a labor intensive, expensive, error prone manufacturing process.

In order to reduce costs and improve customer service, it is important to reduce the number of power modules in inventory. Likewise, in order to improve product quality and further reduce manufacturing costs, it is important to reduce the number of assembly steps. Thus, a need exists for a power module that can be configured to be compatible with a wide variety of lamp types, fixtures, and power sources. Permitting configuration at the point of sale or by the end user would also be preferable.

BRIEF SUMMARY OF THE INVENTION

To those ends, the present invention is a configurable power module for powering a wide variety of lamp systems. The power module includes a base plate for supporting components of the power module. A printed wiring board mounted to the base plate provides for the interconnection of a selected set of electrical components. A ballast mounted on the base plate is connected to the printed wiring board. Capacitor connectors mounted on the printed wiring board allow for the installation of a capacitor when the lamp system in question requires one. An input voltage selector mounted on the printed wiring board provides the power module with compatibility for a wide range of power sources. The printed wiring board includes an ignitor socket that accepts a wide range of ignitors. By optionally selecting and installing an ignitor, capacitor, and ballast, compatibility with a wide variety of existing lamps and future lamp designs is achieved. Other ports offer access to options such as switch quartz, bilevel, and/or wattage selection.

An advantage of the present invention is that it greatly reduces the inventory of power modules since the power module offers the flexibility of being used in multiple fixture types.

Another advantage of the present invention resides in improved power module quality as a result of reducing the amount of hand wiring required to build a power module, the power module appearing virtually wireless to the customer.

Another advantage of the present invention is found in the reduced cost since the amount of hand wiring required to build a power module is reduced.

Still another advantage of the present invention is realized by reduced costs associated with replacing a multitude of low volume power modules with a few high volume power modules.

Yet another advantage is found in the flexibility provided to the end user since the power modules can be reconfigured by the end user for new types of lighting without a substantial investment in new fixtures and power modules components.

A still further advantage of the present invention resides in the ease with which the power module can be tested and maintained.

Still other advantages and benefits of the invention will become apparent to those skilled in the art upon a reading and understanding of the following detail description.

BRIEF DESCRIPTION OF THE DRAWINGS

The figures are for illustration only. They are not to scale and are not intended to limit the invention.

DETAILED DESCRIPTION OF THE INVENTION

Figure 1:
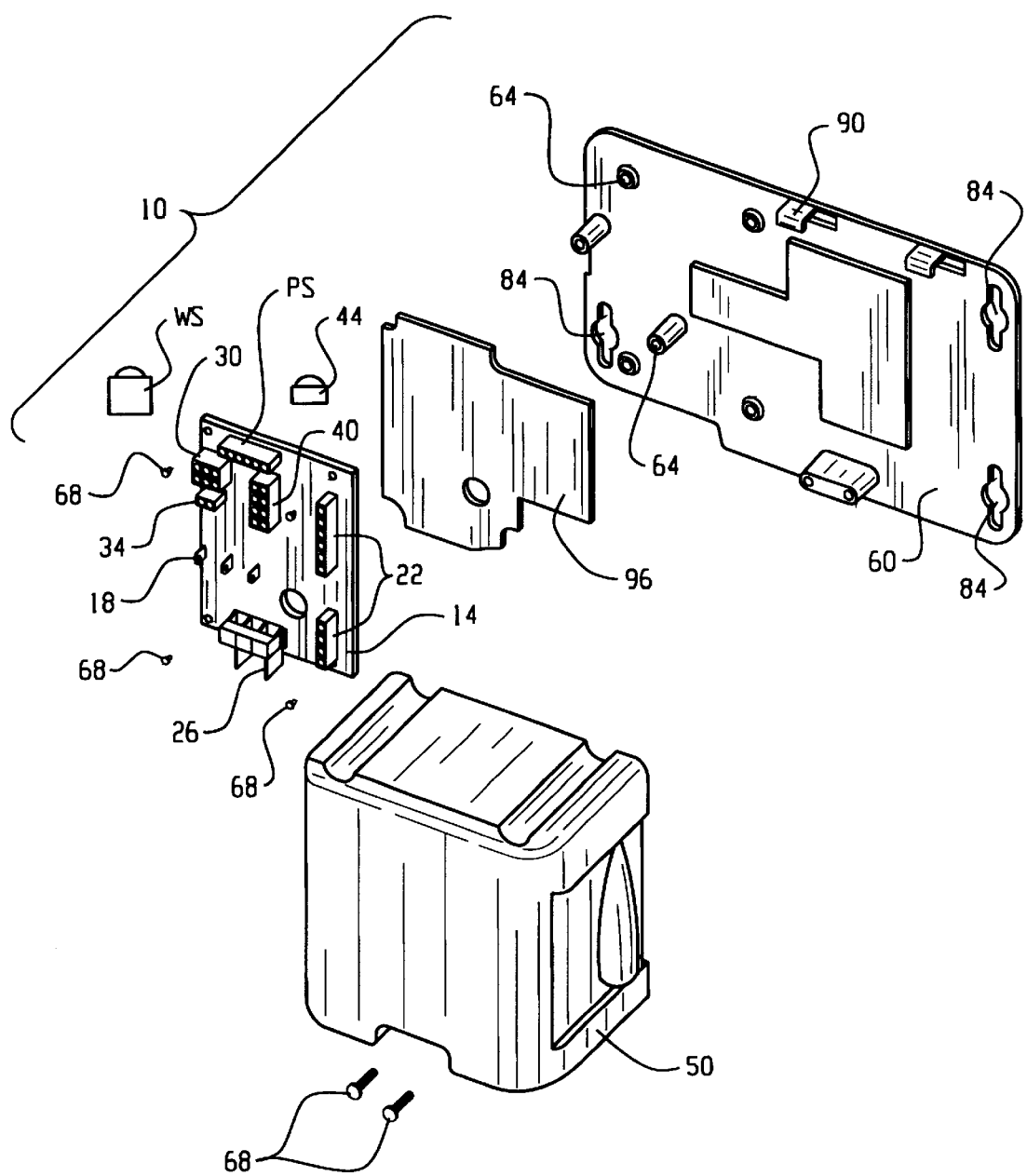
FIG. 1 is an exploded view showing the components of a basic power module of a preferred embodiment of the invention.

Referring now to the drawings, FIG. 1 shows the components of a basic power module 10. The basic power module 10 includes components that are common to all power module configurations. A printed wiring board 14 includes a capacitor connector 18, a ballast connector 22, an ignitor socket 26, a switched quartz line lamp relay connector 30, a bi-level relay connector/wattage selector (WS) 34, a first location 40 for installing a voltage selector 44 and a power connector (PS). A socket can be used to provide service personnel with access to test signals such as input voltage, lamp voltage, and photoelement connectivity.

A base plate 60 for supporting the printed wiring board 14 and other components (not shown) of various power module configurations includes mounting points for securing the printed wiring board 14. In the preferred embodiment, the mounting points are spaced openings or holes 64 for securing fasteners, such as, for example, screws 68 or rivets. In the preferred embodiment, the printed wiring board 14 is mounted to a first or front surface of the base plate 60. However, printed wiring boards can be mounted to other portions of base plates and in other ways without departing from the scope and intent of the present application. An insulator 96 is used to comply with U.L. issues.

Additionally, the base plate contains provisions for mounting power modules to various lighting fixtures. In the preferred embodiment those provisions include, for example, tapered slots 84, although alternative structural arrangements can be used with equal success or in a snap fashion 90. Cover 50 and fasteners 68 are used to secure the ballast, transfer heat, and meet other codes of accessibility.

Figure 2:
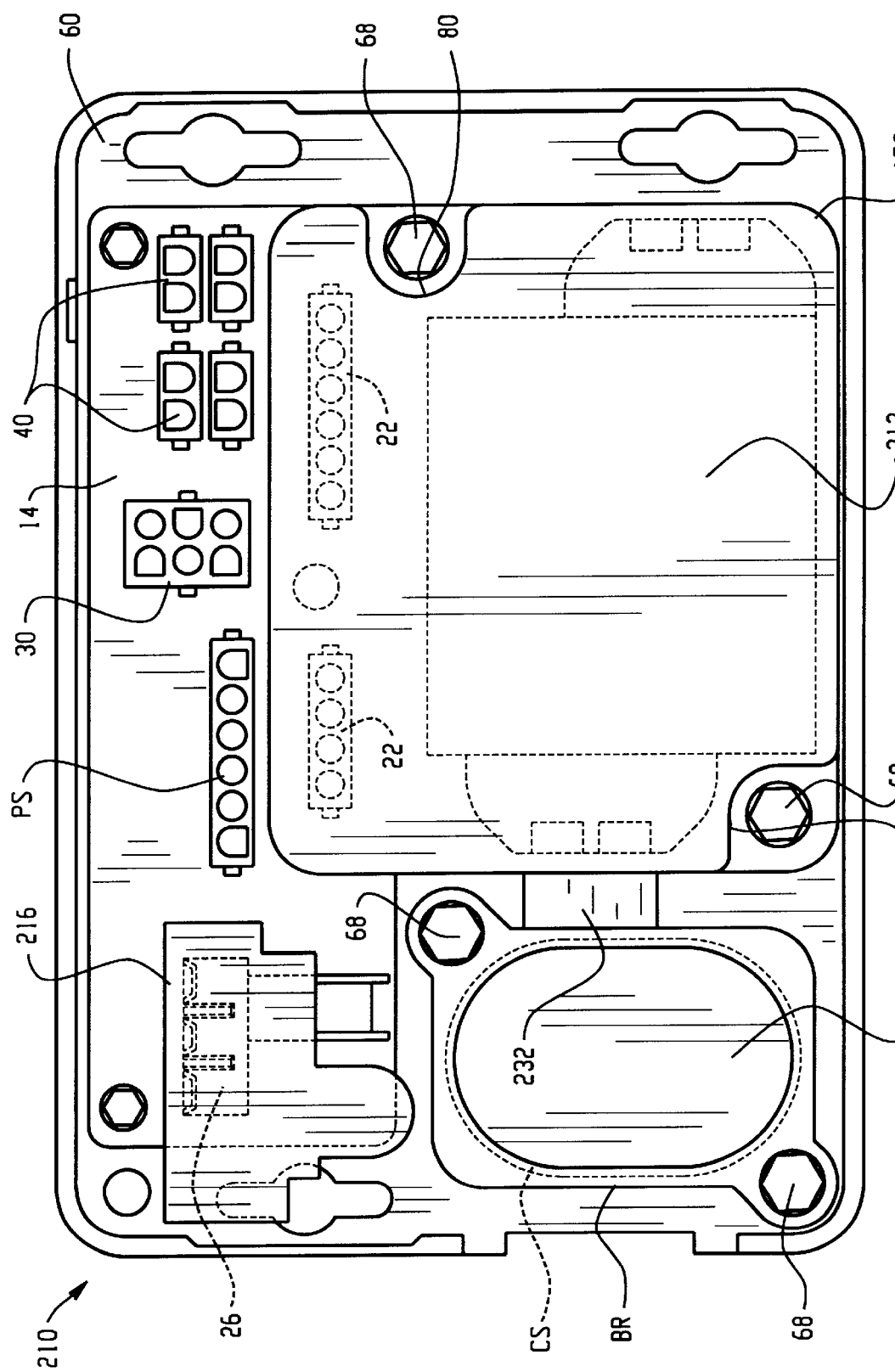
FIG. 2 is a view showing the components of a first power module configuration based on the basic power module of FIG. 1.

The components of a second power module configuration 210 are illustrated in FIG. 2 and include the basic power module 10 components (the printed wiring board 14, the voltage selector 44, and the base plate 60) as well as additional components such a ballast 212, an ignitor 216, and a capacitor 220. In this configuration the ballast 212 selected to be installed is a lag ballast or a CWA (constant wattage auto-regulator) ballast. A lag ballast is installed in order to configure the power module for driving midrange wattage, low to midrange voltage, high-pressure sodium and metal halide lamps. A CWA ballast is installed, for example, in order to configure a power module for driving midrange wattage, mid to high voltage, and metal halide lamps.

Whichever ballast 212 is selected, it will be secured to the base plate 60 via at least two bosses 80 as described with reference to FIG. 2. Ballast electrical connections will also be made in a manner similar to that described in reference to FIG. 2.

The ignitor 216 selected is one adapted for starting the appropriate type of lamp. The ignitor is also mounted and connected in a manner similar to that described above. Moreover, the ignitor 216 is GE type ignitor, although other configurations can be used as dictated by the system.

The capacitor 220 is secured to the power module 210 with a cap shroud CS, two screws 68, and bracket BR. The tie down strap is secured to one of the threaded bosses 80 with a fastener such as a screw 228. Electrical connections from the capacitor are made to the ballast connectors on the printed wiring board 14 or ballast. The electrical connections are made through a capacitor slot 232.

Figure 3:
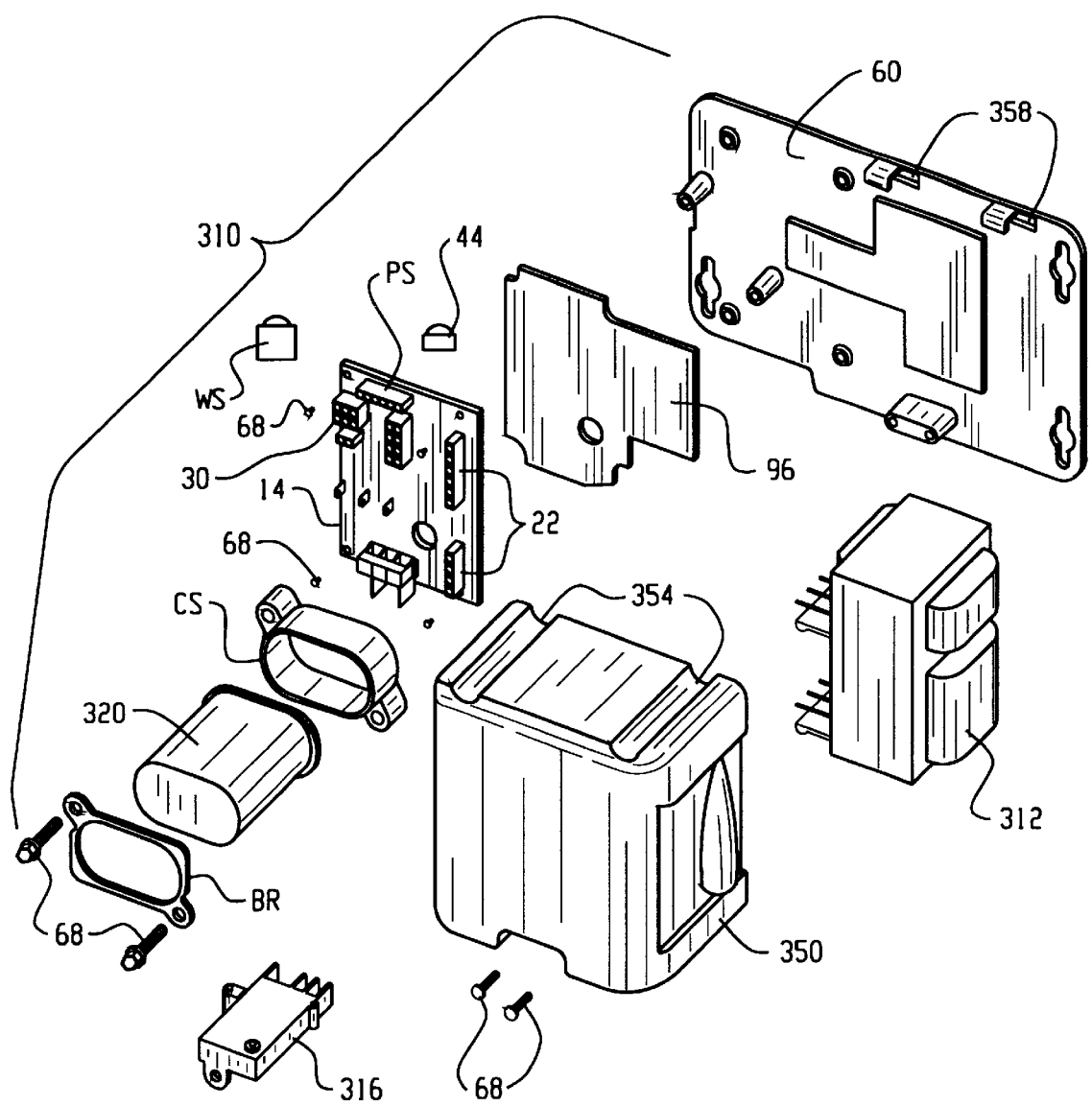
FIGS. 3 and 4 are exploded and assembled views of a second power module configuration based on the basic power module of FIG. 1.

Referring now to FIG. 3, the components of a third power module configuration 310 printed wiring board 14, voltage selector 44, and base plate 60 (the basic power module components). The additional components include a ballast 312, an ignitor 316, a capacitor 320, a switched quartz line lamp relay (not shown) and an optional cover 350. In this configuration the ballast selected to be installed is, for example, a CWA ballast. The third power module configuration can provide power to medium to high wattage pulsed metal halide, high-pressure sodium, and metal halide lamps of all standard voltages. The switched quartz line lamp relay provides for switching in a line powered quartz lamp (not shown) during lamp restarts.

Figure 4:
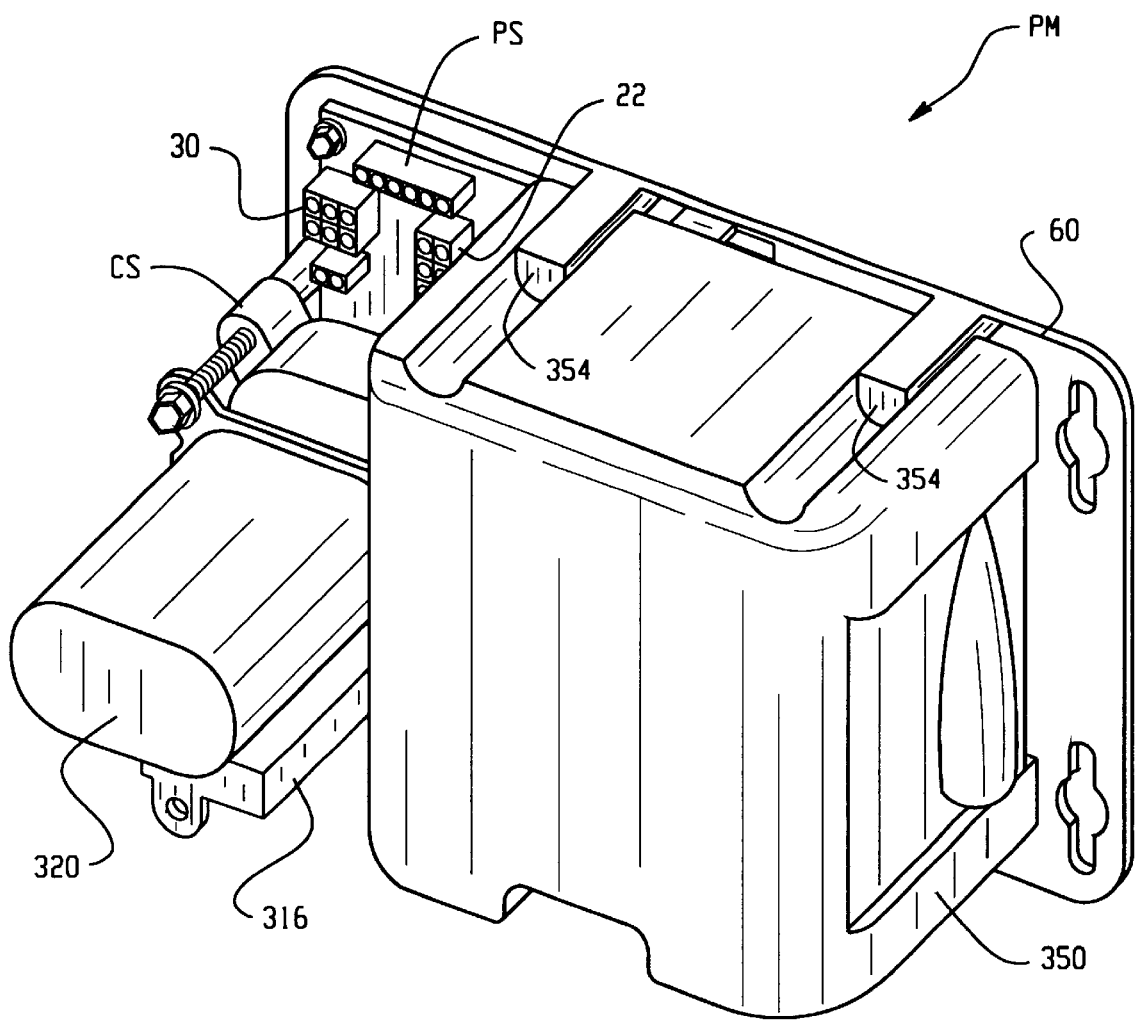

The switched quartz line lamp relay will be connected to the switched quartz relay connector 30 on the printed wiring board. The cover 350 adds protection for high voltage wiring to and from the ballast 312 and aids in receiving agency (U.L. and I.E.C.) approvals. The cover 350 has tabs 354 that hook into cover slots 358 in the base plate 60. All the other components are installed and connected as described with reference to FIGS. 1 and 2. The wattage selector is used to change the power level delivered to a lamp (not shown), thereby providing a low power mode and a high power mode. FIG. 4 is an assembled power module PM as described.

Figure 5:
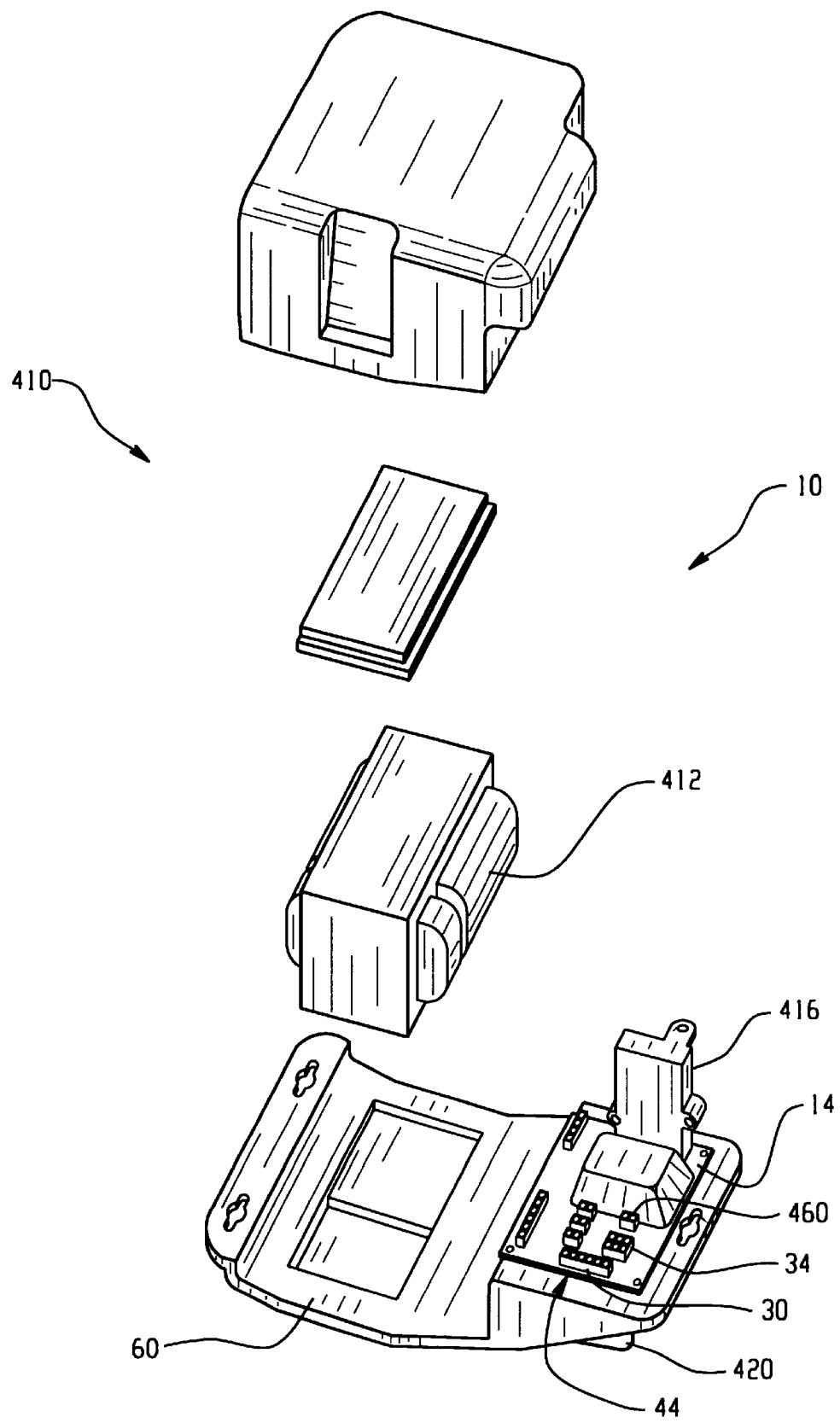
FIGS. 5 and 6 are views of a third power module configuration based on the basic power module of FIG. 1.

The components of a fourth power module configuration 410 are shown in FIG. 5. They include the basic power module 10 components; the printed wiring board 14, the voltage selector 44, and the base plate 60 and additional components including a ballast 412, an ignitor 416, a capacitor 420, a switched quartz connector 30, a cover 450 and a wattage selector 460. In this configuration the selected ballast 412 is, for example, a CWA ballast. The fourth power module configuration 410 provides power to very high wattage high-pressure sodium, and metal halide lamps of all standard voltages. The wattage selector 460 is used to change the power level delivered to a lamp (not shown), thereby providing a low power mode and a high power mode.

This function can also be achieved through the use of the bi-level relay connector 34 on the printed wiring board 14. For, example the output of a remotely located occupancy sensor (not shown) is connected to the bi-level relay connector 34. When an area associated with a lamp is occupied, the power module is switched into high power mode. When the area associated with the lamp is not occupied, the sensor switches the power module can into the low power or stand-by mode.

Figure 6:
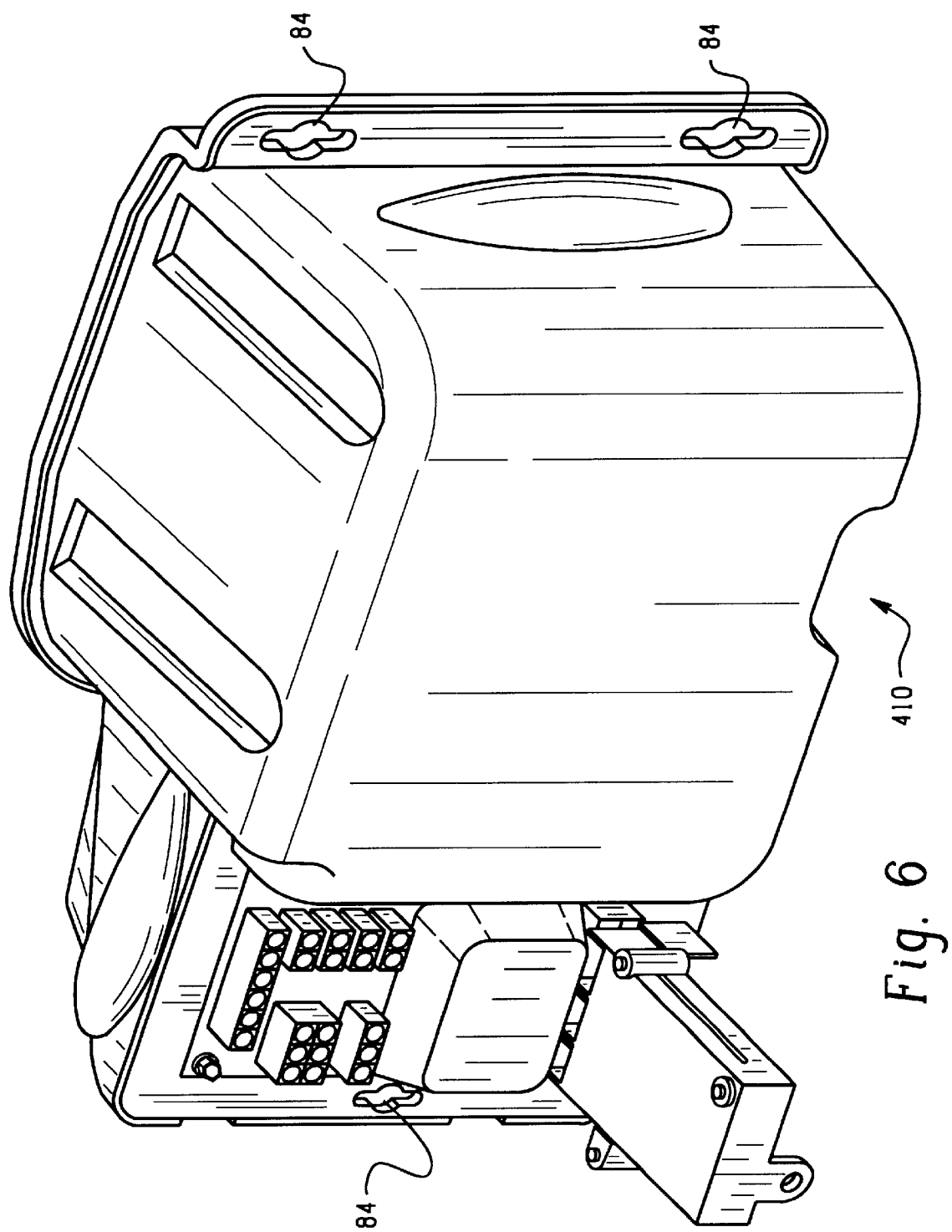

FIG. 6 shows the fourth power module configuration 410 as a completed assembly. The tapered slots 84 in the base plate 60 allow the power module 410 to be placed over the heads of mounting bolts (not shown) and slid into position before the mounting screws are tightened down to secure the power module in a luminaire, such as those depicted in FIGS. 9 and 11.

Figure 7:
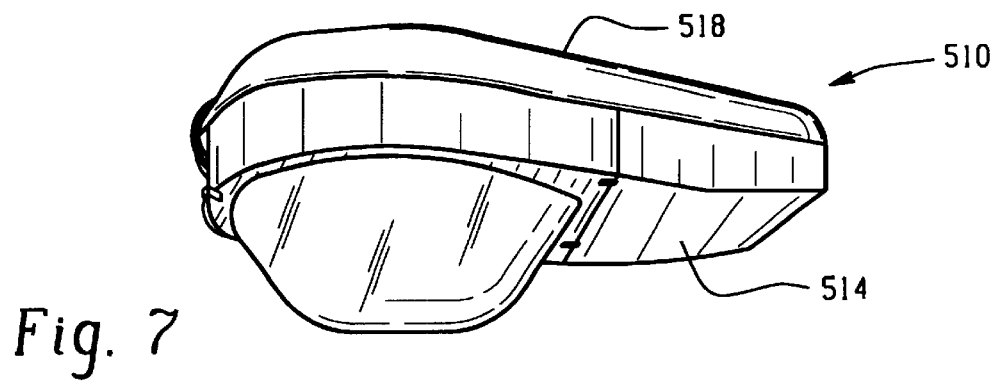
FIG. 7 is a perspective view of a first lamp assembly
Figure 9:
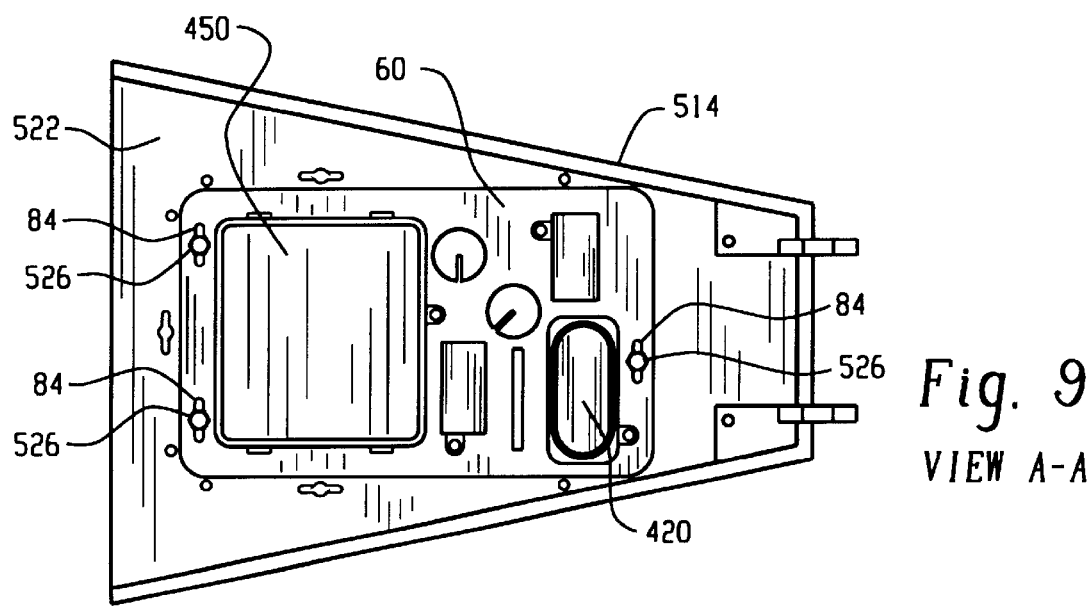
FIG. 9 is a view of an inner surface of the power module door of FIG. 8 taken along sight line AA.

Referring to FIG. 7, a first lamp assembly 510 includes power module 410 (see FIG. 9). The power module 410 is mounted to a power module chamber door 514, preferably along an inner surface 522 thereof The chamber door is installed in main lamp body 518. Therefore, the power module 410 is protected from the external elements and not visible in FIG. 7.

Figure 8:
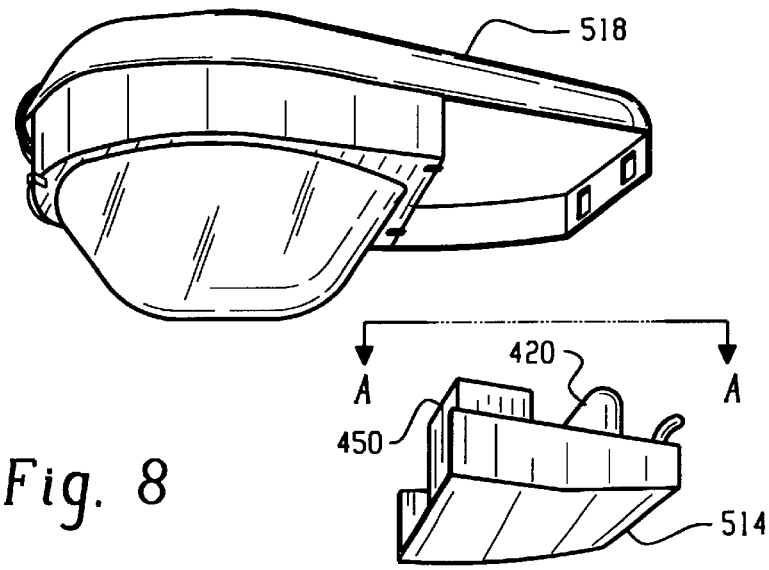
FIG. 8 is a view of the lamp assembly of FIG. 7 with a power module chamber door separated from the rest of the lamp assembly.

In FIG. 8, the power module door 514 is shown removed from the main lamp body 518. The cover 450 and the capacitor 420 from the power module 410 are partially visible.

The power module is shown mounted to an inner surface 522 of the power module door 514 in FIG. 9. The base plate 60 is secured to power module door 514 by fastener bolts 526 which go through the base plate slots 84. Again, the cover 450 and capacitor 420 are visible as are the other components of the power module 410. Obviously, the power module could also me mounted to a surface of the main lamp body 518.

Figure 10:
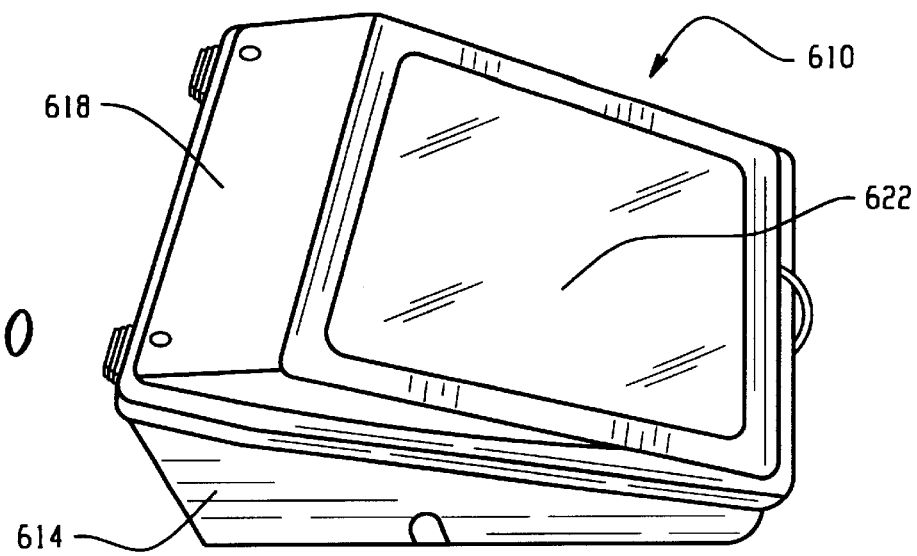
FIG. 10 is an isometric view of a second lamp assembly.

The pattern of slots 84 in the base plate 60 is compatible with a wide range of lamp assemblies. For example, referring to FIG. 10, a second lamp assembly 610 that includes a power module is shown completely assembled. The power module 410 is mounted to an inner surface of a lamp housing 614. A lamp door 618 has a lamp window 622 and acts as a mounting structure for a lamp (not shown). The lamp door 618 covers the lamp enclosure and therefore conceals the power module 410.

Figure 11:
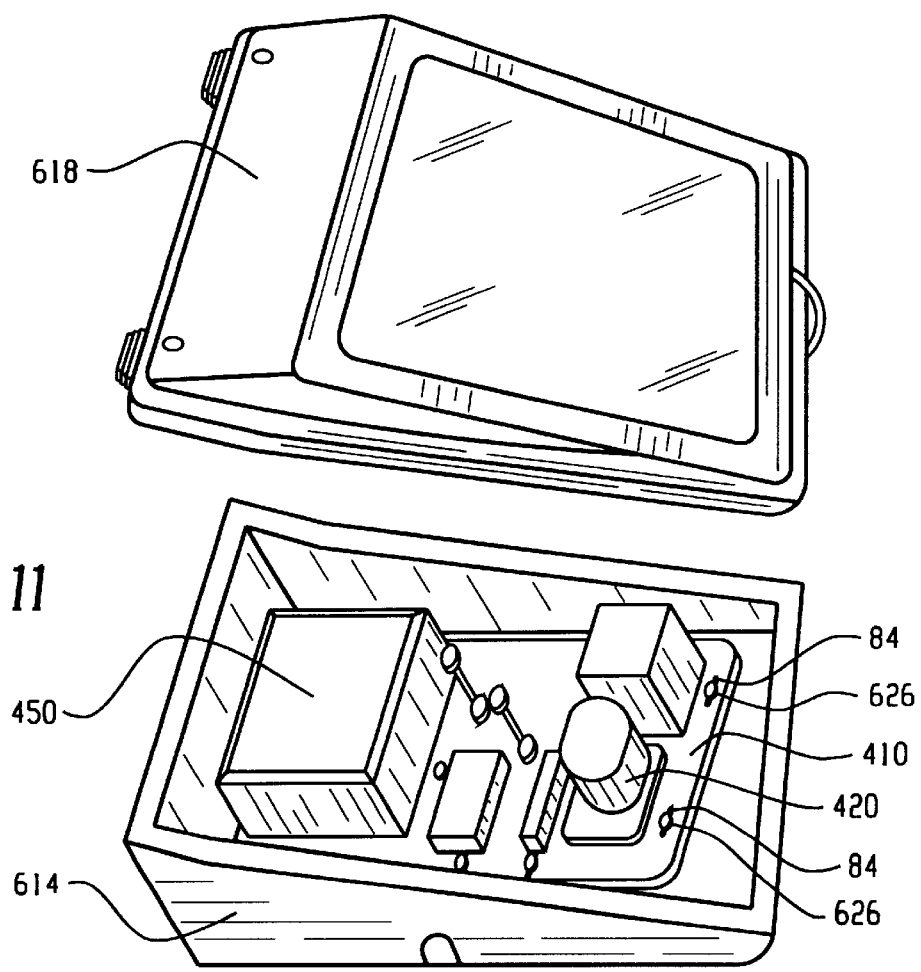
FIG. 11 is a view of the lamp assembly of FIG. 10 with a lamp door separated from the rest of the lamp assembly.

The lamp door 618 is removed in FIG. 11, and the power module 410 is exposed. Again, the pattern of slots 84 in the base plate 60 allows the power module 410 to be mounted with bolts 626 in the lamp housing 614. Additionally the lamp housing 614 and lamp door 618 are designed so as to provide clearance for the height of the tallest power module components, for example the cover 450 and the capacitor 420.

Ideally, only one size ballast and base plate is required to support all lamp sizes and wattage ratings. Unfortunately, the ballasts that are available to power very high wattage lamps can be too large to fit in reasonably sized low wattage fixtures. Therefore, it is understood that several different sized basic power modules may be required to support an entire range of lamp power ratings. In one scheme, it appears that three or four sizes may be enough to cover the existing lamp power ranges. For example, base plates sized to accommodate 100–175, 175–400, and 750–1000 watt lamps appear to be practical.

It is possible to install the components of the disclosed power modules in any order and at any location or series of locations. However, it is preferred that basic power modules be assembled at a factory and delivered to various points-of-sale. Power modules are preferably completed by a vendor at a time of sale, or sold in kit form and assembled by installers or end users.

The power module of the present invention offers the flexibility of being used in multiple fixture types. This is not presently available in the industry. The power modules described herein fit in area, flood, and wallpack HID fixtures. This further complements other features associated with this invention such as the ability to economize based on mass production, accommodate delayed identification of product required by a customer, and reduce inventory SKU.

Presently, customer complaints result from configuring multi-watt and/or multi-volt luminaires. The ability to easily select and plug in the desired voltage and wattage solves many of these complaints over traditional wiring methods. Likewise, plug in ignitors, switch quartz, and bi-level options can be easily selected in response to particular needs of a customer.

Another common customer complaint that is remedied by the present invention relates to the confusing mesh of wires associated with a traditional power module system. As is evident, the power module shown and described herein appears virtually wireless to a customer.

Diagnostic tool access is also simplified by providing a plug in port such as socket 26. This port allows low skill labor to troubleshoot, diagnose, and repair lighting systems. This option simply is not available with traditional systems.

It will also be appreciated that the power module of the present application allows easy upgrade of the lamp from one type to another. For example, the fixture can be upgraded from a standard metal halide lamp to a pulse metal halide fixture by adding a plug-in ignitor.

The invention has been described with reference to preferred embodiments. Obviously modifications and alterations will occur to others upon reading and understanding this specification. For example, other configurations and combinations of components can be used, other kinds of ballasts can be used, such as, for example CWA, Mag reg, electronic, and hybrid ballasts can be used. Support for other features can be added to the power module. For example, time of day type dimming, remote control (for example, infra red, sonic and/or power line carrier remote control). Of course, other kinds of fasteners, connectors and sockets can be used. The invention is intended to include all such modifications and alterations in so far as they come within the scope of the appended claims and the equivalents thereof.

What is claimed is:

1. A configurable power module for powering a wide variety of lamps comprising:

a base plate for supporting components of the power module;

a printed wiring board mounted to the base plate, for interconnecting components of the power module;

a ballast connector mounted on the printed wiring board;

capacitor connectors mounted on the printed wiring board for accepting a capacitor; and a voltage selector mounted on the printed wiring board.

2. The configurable power module of claim 1 further comprising a wattage selector mounted on the printed wiring board.

3. The configurable power module of claim 1 wherein the base plate further comprises provisions for mounting the base plate in a variety of lighting fixtures.

4. The configurable power module of claim 1 wherein the base plate further comprises threaded bosses for securing components.

5. The configurable power module of claim 1 further comprising an ignitor socket mounted on the printed wiring board for accepting an ignitor.

6. The configurable power module of claim 5 wherein the ignitor or power socket is a test socket.

7. The configurable power module of claim 1 further comprising a connector mounted on the printed wiring board for accepting a switched quartz lamp relay.

8. The configurable power module of claim 1 further comprising a capacitor mounted on the base plate.

9. The configurable power module of claim 1 further comprising a ballast mounted to the base plate.

10. The configurable power module of claim 9 wherein the ballast is a lag type ballast.

11. The configurable power module of claim 9 wherein the ballast is a CWA type ballast.

12. The configurable power module of claim 1 further comprising a bi-level relay connector mounted on the printed wiring board for accepting a bi-level relay.

13. The configurable power module of claim 12 further comprising a bi-level relay connected to the bi-level relay connector, the bi-level relay for switching the power level delivered to the high intensity discharge lamp in response to a control signal.

14. A method for manufacturing a power module for powering a lamp system comprising the steps of:

providing a base plate for supporting components of the power module;

securing a printed wiring board to the base plate;

installing a voltage selector on the printed wiring board; and installing an ignitor socket mounted on the printed wiring board to complete a basic power module.

15. The method of claim 14 further comprising the steps of:

mounting a ballast on the base plate; and connecting conductors from the ballast to the printed wiring board.

16. The method of claim 14 further comprising the steps of:

deciding if additional components are required; and if additional components are required, installing additional components.

17. The method of claim 15 further comprising selecting the ballast from the group of a lag ballast, a reactor ballast and an CWA ballast.

18. The method of claim 14 further comprising installing a bi-level relay connector on the printed wiring board.

19. The method of claim 14 further comprising selecting additional components from the group of a capacitor, a wattage selector, a switched quartz relay, a bi-level relay, a cover, and an ignitor.

20. The method of claim 14 wherein the installing steps include toollessly inserting components, including the voltage selector and ignitor socket, to the printed wiring board.

* * * * *